(12) United States Patent
Arai et al.

(10) Patent No.: US 10,365,679 B2
(45) Date of Patent: Jul. 30, 2019

(54) REGENERATIVE CURRENT DETECTION CIRCUIT, CHARGE CURRENT DETECTION CIRCUIT, AND MOTOR CURRENT DETECTION SYSTEM

(71) Applicant: KABUSHIKI KAISHA TOSHIBA, Tokyo (JP)

(72) Inventors: Daisuke Arai, Kawasaki Kanagawa (JP); Tooru Asakawa, Kawasaki Kanagawa (JP); Masahiro Shimozono, Kawasaki Kanagawa (JP); Katsumi Shiokawa, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/690,258

(22) Filed: Aug. 29, 2017

(65) Prior Publication Data

US 2018/0196457 A1  Jul. 12, 2018

(30) Foreign Application Priority Data

Jan. 11, 2017 (JP) ................ 2017-002501

(51) Int. Cl.
*H02P 7/00* (2016.01)
*G05F 3/26* (2006.01)
(Continued)

(52) U.S. Cl.
CPC .......... *G05F 3/26* (2013.01); *G01R 19/0038* (2013.01); *G01R 19/145* (2013.01); *G01R 31/40* (2013.01); *H02M 3/156* (2013.01); *H03F 1/086* (2013.01); *H03F 1/342* (2013.01); *H03F 3/217* (2013.01); *H03F 3/2173* (2013.01);
(Continued)

(58) Field of Classification Search
CPC ..... H02J 7/0068; H02J 7/345; B60L 11/1811; G05F 3/26; G05F 1/56; H02P 7/29; G01R 19/00; G01R 19/145; G01R 31/40; H02M 3/156; H03F 1/08; H03F 1/34;
(Continued)

(56) References Cited

U.S. PATENT DOCUMENTS 6,134,123 A * 10/2000 Yamada ............ H02M 3/33507
                                                      363/21.13
7,068,007 B2    6/2006 Silitonga
(Continued)

FOREIGN PATENT DOCUMENTS

JP    2006-129543 A    5/2006
JP    2006129543 A1 *  5/2006  ................ H02P 8/12
(Continued)

*Primary Examiner* — Roy K Potter
(74) *Attorney, Agent, or Firm* — Kim & Stewart LLP

(57) ABSTRACT

A regenerative current detection circuit includes a first power MOS transistor that is configured as a current mirror to a second power MOS transistor connected to drive a motor winding, a first feedback amplifier that compares a first regenerative current that flows in the first power MOS transistor with a second regenerative current that flows in the second power MOS transistor and outputs a comparison result, the first regenerative current being obtained by multiplying the second regenerative current by a current mirror ratio, and a current detection circuit that outputs a detection current based on the comparison result.

8 Claims, 11 Drawing Sheets

(51) Int. Cl.
  *G01R 19/145* (2006.01)
  *G01R 19/00* (2006.01)
  *G01R 31/40* (2014.01)
  *H02M 3/156* (2006.01)
  *H03F 1/34* (2006.01)
  *H03F 1/08* (2006.01)
  *H03F 3/217* (2006.01)
  *H03K 17/687* (2006.01)
  *H03K 17/082* (2006.01)
  *H02M 1/00* (2006.01)

(52) U.S. Cl.
  CPC ..... *H03K 17/0822* (2013.01); *H03K 17/6871* (2013.01); *H02M 2001/0009* (2013.01); *H03F 2200/351* (2013.01); *H03F 2200/462* (2013.01); *H03F 2200/471* (2013.01); *H03F 2200/474* (2013.01); *H03F 2200/78* (2013.01); *H03K 2217/0027* (2013.01); *H03K 2217/0045* (2013.01)

(58) Field of Classification Search
  CPC ...... H03F 3/217; H03F 3/2171; H03F 3/2178; H03K 17/687; Y02T 10/642; Y02T 10/7258
  USPC .......................................... 257/138; 388/811
  See application file for complete search history.

(56) References Cited

U.S. PATENT DOCUMENTS

| | | | |
|---|---|---|---|
| 7,848,073 B2 | 12/2010 | Takahashi | |
| 9,331,616 B2* | 5/2016 | Swanson | ................... H02P 7/00 |
| 2016/0301235 A1* | 10/2016 | Okanoue | .............. H02H 11/003 |

FOREIGN PATENT DOCUMENTS

| | | |
|---|---|---|
| JP | 2006-329655 A | 12/2006 |
| JP | 2007-295184 A | 11/2007 |
| JP | 2010-199829 A | 9/2010 |

* cited by examiner

FIG. 1

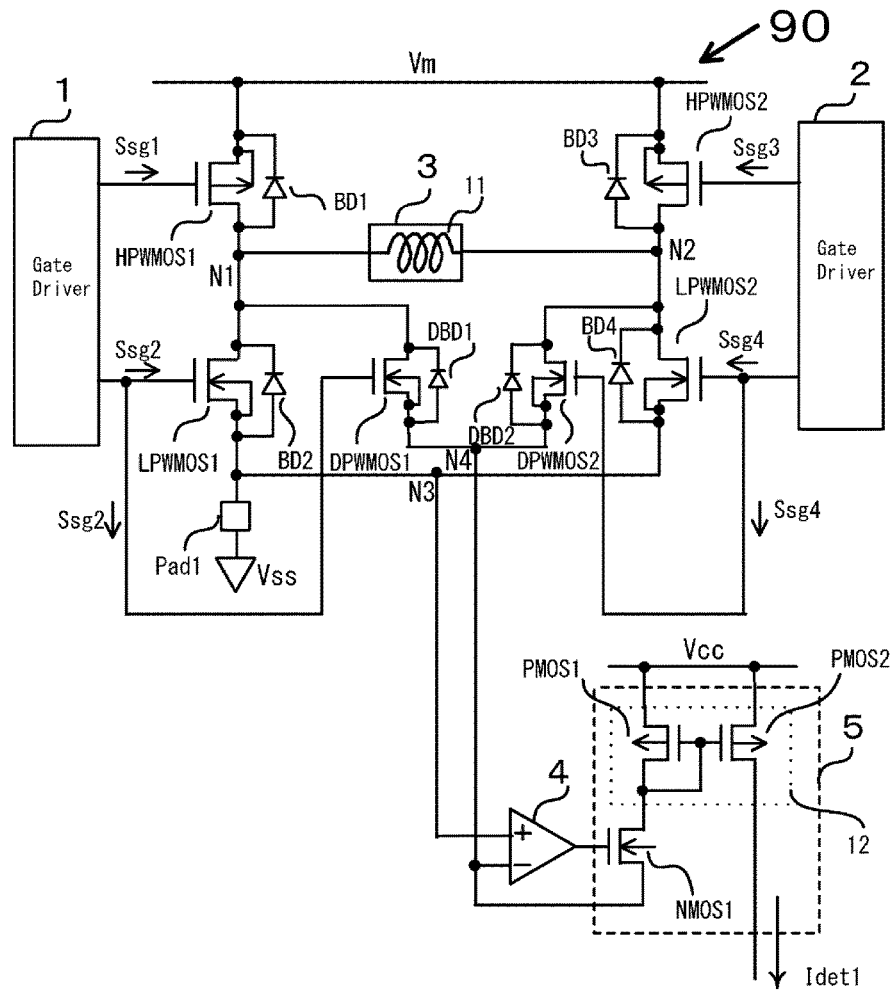

1, 2 — GATE DRIVER
4 — FEEDBACK AMPLIFIER
11 — MOTOR COIL
90 — REGENERATIVE CURRENT
    DETECTION CIRCUIT
BD1~4, DBD1, DBD2 — BODY DIODE
DPWMOS1, DPWMOS2, HPWMOS1, HPWMOS2, LPWMOS1, LPWMOS2 — POWER MOS TRANSISTOR
Idet1 — DETECTION CURRENT
NMOS1 — Nch MOS TRANSISTOR
PMOS1, PMOS2 — Pch MOS TRANSISTOR
Vcc, Vm — POWER SUPPLY
         (HIGH POTENTIAL SIDE
         POWER SUPPLY)
3 — MOTOR
5 — CURRENT DETECTION UNIT
12 — CURRENT MIRROR CIRCUIT
N1~N4 — NODE
Pad1 — TERMINAL
Ssg1~4 — CONTROL SIGNAL
Vss — GROUND POTENTIAL
      (LOW POTENTIAL POWER SUPPLY)

FIG. 2A

| HPWMOS1 | LSPWMOS1 | HPWMOS2 | LSPWMOS2 | CHARGE CURRENT |
|---|---|---|---|---|
| "ON" | "OFF" | "OFF" | "ON" | Vm→HPWMOS1→MOTOR3→LPWMOS2→Pad1 |
| "OFF" | "ON" | "ON" | "OFF" | Vm→HPWMOS2→MOTOR3→LPWMOS1→Pad1 |

FIG. 2B

| HPWMOS1 | LSPWMOS1 | HPWMOS2 | LSPWMOS2 | REGENERATIVE CURRENT |
|---|---|---|---|---|
| "ON"→"OFF" | "OFF" | "OFF" | "ON"→"OFF" | Pad1→LPWMOS1→MOTOR3→HPWMOS2→Vm |
| "OFF" | "OFF"→"ON" | "OFF"→"ON" | "OFF" | Pad1→LPWMOS1→MOTOR3→HPWMOS2→Vm |
| "OFF" | "ON"→"OFF" | "ON"→"OFF" | "OFF" | Pad1→LPWMOS2→MOTOR3→HPWMOS1→Vm |
| "OFF"→"ON" | "OFF" | "OFF" | "OFF"→"ON" | Pad1→LPWMOS2→MOTOR3→HPWMOS1→Vm |

I1, I2, I1a, I1b, I2a, I2b ⋯ REGENERATIVE CURRENT

100 --- MOTOR CURRENT DETECTION SYSTEM
111 --- DETECTION TRANSISTOR UNIT
D1~5 --- BODY DIODE
DM1~5 --- POWER MOS TRANSISTOR
N5 --- NODE

8 ··· CURRENT DETECTION UNIT
21 ··· CURRENT MIRROR CIRCUIT
KR1 ··· VARIABLE RESISTOR
N21, N6 ··· NODE
Sct, Ssg5, Ssg6 ··· CONTROL SIGNAL
Vref ··· REFERENCE VOLTAGE 20 ··· FEEDBACK AMPLIFIER
50 ··· COMPARATOR
NM1, NM2 ··· Nch MOS TRANSISTOR
PM1~4 ··· Pch MOS TRANSISTOR
Vdet ··· DETECTION VOLTAGE

FIG. 8A

| HPWMOS1 | LSPWMOS1 | HPWMOS2 | LSPWMOS2 | CHARGE CURRENT |
|---------|----------|---------|----------|----------------|
| "ON" | "OFF" | "OFF" | "ON" | Vm→HPWMOS1→MOTOR3→LPWMOS2→Pad1 |
| "OFF" | "ON" | "ON" | "OFF" | Vm→HPWMOS2→MOTOR3→LPWMOS1→Pad1 |

FIG. 8B

| CHARGE CURRENT DETECTION UNIT 121 | "Active" |
|---|---|
| REGENERATIVE CURRENT DETECTION UNIT 122 | "Nonactive" |
| VOLTAGE DETECTION UNIT 130 | "Active" |

FIG. 8C

| $V_{N1}$ | "$V_{DS}$" |
|---|---|
| $V_{N11}$ | "$1/3 V_{DS}$" |

FIG. 10A

| HPWMOS1 | LSPWMOS1 | HPWMOS2 | LSPWMOS2 | REGENERATIVE CURRENT |
|---|---|---|---|---|
| "ON"→"OFF" | "OFF" | "OFF" | "ON"→"OFF" | Pad1→LPWMOS1→MOTOR3→HPWMOS2→Vm |
| "OFF" | "OFF"→"ON" | "OFF"→"ON" | "OFF" | Pad1→LPWMOS1→MOTOR3→HPWMOS2→Vm |
| "OFF" | "ON"→"OFF" | "ON"→"OFF" | "OFF" | Pad1→LPWMOS2→MOTOR3→HPWMOS1→Vm |
| "OFF"→"ON" | "OFF" | "OFF" | "OFF"→"ON" | Pad1→LPWMOS2→MOTOR3→HPWMOS1→Vm |

FIG. 10B

| | |
|---|---|
| CHARGE CURRENT DETECTION UNIT 121 | "Nonactive" |
| REGENERATIVE CURRENT DETECTION UNIT 122 | "Active" |
| VOLTAGE DETECTION UNIT 130 | "Active" |

Sct1 ⋯ CONTROL SIGNAL
Vdet1 ⋯ DETECTION VOLTAGE
Vref1 ⋯ REFERENCE VOLTAGE

REGENERATIVE CURRENT DETECTION CIRCUIT, CHARGE CURRENT DETECTION CIRCUIT, AND MOTOR CURRENT DETECTION SYSTEM

This application is based upon and claims the benefit of priority from Japanese Patent Application No. 2017-002501, filed Jan. 11, 2017, the entire contents of which are incorporated herein by reference.

FIELD

Embodiments described herein relate generally to a regenerative current detection circuit, a charge current detection circuit, and motor current detection system.

BACKGROUND

When a motor such as a DC motor or a stepping motor is driven with high efficiency, a motor current is controlled by a pulse width modulation (PWM) control using a half bridge circuit or a full bridge circuit and includes a charge current and a regeneration current. It is important to detect the motor current with high accuracy in a system for driving the motor.

A method of motor current detection in which a sense resistor is inserted between a motor and a drive circuit and a motor current is detected as a voltage between both ends of the sense resistor to be controlled, or a method in which a motor current is detected as a drain-source voltage of an output power MOS transistor of a drive circuit to be controlled, or the like is known.

In the method of using a sense resistor, an external resistor is used as the sense resistor and thus, there is a problem that it is not possible to reduce the number of components and in the method of using detection of a drain-source voltage of the output power MOS transistor, there is a problem that detection accuracy of a regenerative current is reduced.

DESCRIPTION OF THE DRAWINGS

FIG. 1 is a circuit diagram illustrating a regenerative current detection circuit according to a first embodiment.

FIGS. 2A and 2B are diagrams for explaining a charge current and a regenerative current according to the first embodiment.

FIGS. 8A to 8C are diagrams for explaining the detection of a charge current generated in the motor current detection system according to the second embodiment.

FIGS. 10A and 10B are diagrams for explaining the detection of a regenerative current generated in the motor current detection system according to the second embodiment.

DETAILED DESCRIPTION

Figure 3A:
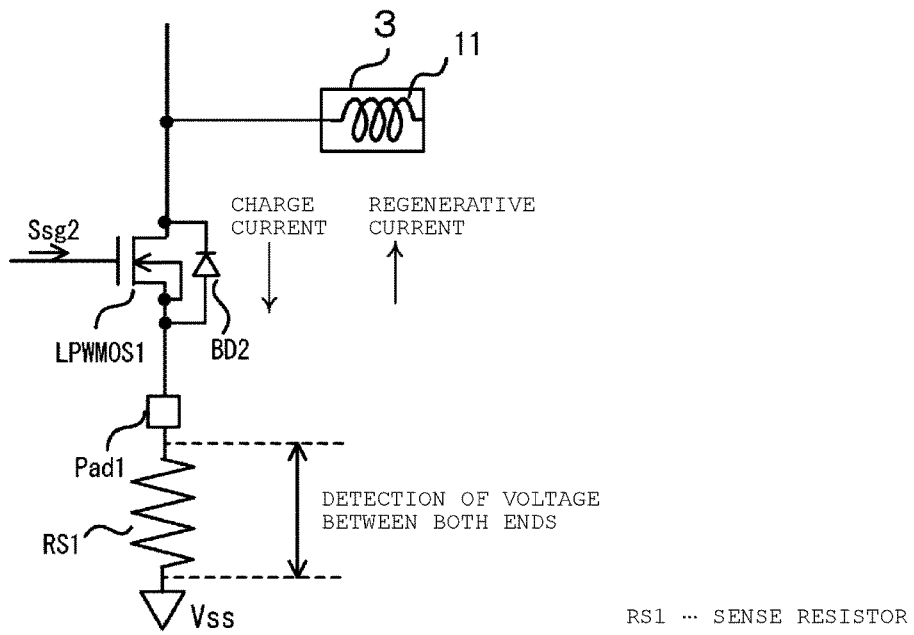
FIGS. 3A and 3B are diagrams illustrating motor current detection in a first comparative example.

An embodiment provides a regenerative current detection circuit, a charge current detection circuit, and a motor current detection system that detect a motor current with high accuracy.

In general, according to one embodiment, a regenerative current detection circuit includes a first power MOS transistor that is configured as a current mirror to a second power MOS transistor connected to drive a motor winding, a first feedback amplifier that compares a first regenerative current that flows in the first power MOS transistor with a second regenerative current that flows in the second power MOS transistor and outputs a comparison result, the first regenerative current being obtained by multiplying the second regenerative current by a current mirror ratio, and a current detection circuit that outputs a detection current based on the comparison result.

In the following, embodiments of the invention will be described with reference to the drawings.

First Embodiment

First, a regenerative current detection circuit according to a first embodiment is described with reference to the drawings. FIG. 1 is a circuit diagram illustrating the regenerative current detection circuit. In the first embodiment, a body diode for detection disposed in parallel with a power MOS transistor for detection is provided in a power MOS transistor of the low-side and a regenerative current flowing to the low-side is detected with high accuracy.

As illustrated in FIG. 1, a regenerative current detection circuit 90 includes a gate driver 1, a gate driver 2, a motor 3, a feedback amplifier 4, a current detection unit 5, power MOS transistors HPWMOS1 and HPWMOS2, power MOS transistors LPWMOS1 and LPWMOS2, power MOS transistors DPWMOS1 and DPWMOS2, body diodes BD1 to BD4, body diodes DBD1 and DBD2, and a terminal Pad1.

The motor 3 represents a DC motor, a stepping motor, or the like. The regenerative current detection circuit 90 detects the regenerative current generated in the motor 3 and flowing to the low-side with high accuracy using the power MOS transistor for detection and the body diode for detection, and is described in more detail below.

The gate driver 1 generates a control signal Ssg1 and a control signal Ssg2. The gate driver 2 generates a control signal Ssg3 and a control signal Ssg4. The control signals Ssg1 to Ssg4 are PWM-controlled signals.

The power MOS transistor HPWMOS1 is a Pch power MOS transistor of the high-side. One end (source) of the power MOS transistor HPWMOS1 is connected to a power supply (high potential side power supply) Vm, the other end (drain) thereof is connected to a node N1 and one end of a motor coil 11 of the motor 3, and the control signal Ssg1 is input to a control terminal (gate) thereof. When the control signal Ssg1 is in an enable state (low level), the power MOS transistor HPWMOS1 is turned ON.

A cathode of the body diode BD1 is connected to one end of the power MOS transistor HPWMOS1, an anode thereof is connected to the other end of the power MOS transistor HPWMOS1, the body diode BD1 thus being connected in parallel with the power MOS transistor HPWMOS1.

The power MOS transistor LPWMOS1 is an Nch power MOS transistor of the low-side. One end (drain) of the power MOS transistor LPWMOS1 is connected to the node N1 and the one end of the motor coil 11 of the motor 3, the other end (source) thereof is connected to a ground potential (low potential side power supply) Vss through the terminal Pad1, and the control signal Ssg2 is input to a control terminal (gate) thereof. When the control signal Ssg2 is in an enable state (high level), the power MOS transistor LPWMOS1 is turned ON.

A cathode of the body diode BD2 is connected to one end of the power MOS transistor LPWMOS1, an anode thereof is connected to the other end of the power MOS transistor LPWMOS1, the body diode BD2 thus being connected in parallel with the power MOS transistor LPWMOS1.

The power MOS transistor DPWMOS1 is an Nch power MOS transistor for detection. One end (drain) of the power MOS transistor DPWMOS1 is connected to the node N1 and the one end of the motor coil 11 provided in the motor 3, the other end (source) thereof is connected to a node N4, and the control signal Ssg2 is input to a control terminal (gate) thereof.

The body diode DBD1 is a body diode for detection. A cathode of the body diode DBD1 is connected to one end of the power MOS transistor DPWMOS1, an anode thereof is connected to the other end of the power MOS transistor DPWMOS1, the body diode DBD1 thus being connected in parallel with the power MOS transistor DPWMOS1.

The power MOS transistor HPWMOS2 is a Pch power MOS transistor of the high-side. One end (source) of the power MOS transistor HPWMOS2 is connected to the power supply (high potential side power supply) Vm, the other end (drain) thereof is connected to a node N2 and the other end of the motor coil 11 of the motor 3, and the control signal Ssg3 is input to a control terminal (gate). When the control signal Ssg3 is in an enable state (low level), the power MOS transistor HPWMOS2 is turned ON.

A cathode of the body diode BD3 is connected to one end of the power MOS transistor HPWMOS2, an anode thereof is connected to the other end of the power MOS transistor HPWMOS2, the body diode BD3 thus being connected in parallel with the power MOS transistor HPWMOS2.

The power MOS transistor LPWMOS2 is an Nch power MOS transistor of the low-side. One end (drain) of the power MOS transistor LPWMOS2 is connected to the node N2 and the other end of the motor coil 11 of the motor 3, the other end (source) thereof is connected to the ground potential (low potential side power supply) Vss through the terminal Pad1, and the control signal Ssg4 is input to a control terminal (gate) thereof. When the control signal Ssg4 is in an enable state (high level), the power MOS transistor LPWMOS2 is turned ON.

A cathode of the body diode BD4 is connected to one end of the power MOS transistor LPWMOS2, an anode thereof is connected to the other end of the power MOS transistor LPWMOS2, the body diode BD4 thus being connected in parallel with the power MOS transistor LPWMOS2.

The power MOS transistor DPWMOS2 is an Nch power MOS transistor for detection. One end (drain) of the power MOS transistor DPWMOS2 is connected to the node N2 and the other end of the motor coil 11 of the motor 3, the other end (source) thereof is connected to the node N4, and the control signal Ssg4 is input to a control terminal (gate) thereof.

The body diode DBD2 is a body diode for detection. A cathode of the body diode DBD2 is connected to one end of the power MOS transistor DPWMOS2, an anode thereof is connected to the other end of the power MOS transistor DPWMOS2, the body diode DBD2 thus being connected in parallel with the power MOS transistor DPWMOS2.

A plus (+) port of an input side of a feedback amplifier (i.e., positive input) 4 is connected to the node N3 (the other end of the power MOS transistor LPWMOS1 and the other end of the power MOS transistor LPWMOS2), a minus (−) port of the input side thereof (i.e., negative input) is connected to the node N4 (the other end of the power MOS transistor DPWMOS1 and the other end of the power MOS transistor DPWMOS2), and the feedback amplifier 4 compares a signal of the plus (+) port of the input side with a signal of the minus (−) port of the input side and outputs the comparison result.

The current detection unit 5 includes an Nch MOS transistor NMOS1, a Pch MOS transistor PMOS1, and a Pch MOS transistor PMOS2. The Pch MOS transistor PMOS1 and the Pch MOS transistor PMOS2 constitute a current mirror circuit 12.

One end (source) of the Pch MOS transistor PMOS1 is connected to a power supply (high potential side power supply) Vcc and a control terminal (gate) thereof is connected to the other end (drain). One end (source) of the Pch MOS transistor PMOS2 is connected to the power supply (high potential side power supply) Vcc and a control terminal (gate) is connected to the control terminal (gate) of Pch MOS transistor PMOS1.

One end (drain) of the Nch MOS transistor NMOS1 is connected to the drain of the Pch MOS transistor PMOS1, an output signal of the feedback amplifier 4 is input to the control terminal (gate), and the other end (source) thereof is connected to the node N4 and the minus (−) port of the input side of the feedback amplifier 4.

When the output signal of the feedback amplifier 4 is at a high level, the Nch MOS transistor NMOS1 is turned ON. In this case, the current mirror circuit 12 operates and a detection current Idet1 is detected from the other end (drain) side of the Pch MOS transistor PMOS2. When the Nch MOS transistor NMOS1 is turned ON, a signal output from the other end side of the Nch MOS transistor NMOS1 is feedback-input to the minus (−) port of the input side of the feedback amplifier 4.

Here, a power supply voltage of the power supply Vm is set to be higher than a power supply voltage of the power supply Vcc which is set to, for example, 5V. The Nch MOS transistor NMOS1, the Pch MOS transistor PMOS1, and the Pch MOS transistor PMOS2 have breakdown voltages lower than those of the power MOS transistors HPWMOS1 and HPWMOS2, the power MOS transistors LPWMOS1 and LPWMOS2, and the power MOS transistors DPWMOS1 and DPWMOS2 and use, for example, logic-system transistors.

The charge current and the regenerative current generated in a system including the power MOS transistors HPWMOS1 and HPWMOS2, the power MOS transistors LPWMOS1 and LPWMOS2, and the motor 3 is described with reference to FIGS. 2A and 2B, which illustrate paths in which the charge current and the regenerative current are respectively present.

As illustrated in FIG. 2A, when the power MOS transistor HPWMOS1 and the power MOS transistor LPWMOS2 are turned "ON" and the power MOS transistor HPWMOS2 and the power MOS transistor LPWMOS1 are turned "OFF", a charge current flows from the power supply Vm, the power MOS transistor HPWMOS1, the motor 3, the power MOS transistor LPWMOS2, and to the terminal Pad1 in this order.

On the other hand, when the power MOS transistor HPWMOS2 and the power MOS transistor LPWMOS1 are turned "ON" and the power MOS transistor HPWMOS1 and the power MOS transistor LPWMOS2 are turned "OFF", the charge current flows from the power supply Vm, the power MOS transistor HPWMOS2, the motor 3, the power MOS transistor LPWMOS1, and to the terminal Pad1 in this order.

As also illustrated in FIG. 2B, when the power MOS transistor HPWMOS1 and the power MOS transistor LPWMOS2 are turned from "ON" to "OFF" and the power MOS transistor HPWMOS2 and the power MOS transistor LPWMOS1 are in an "OFF" state, a regenerative current flows from the terminal Pad1, the power MOS transistor LPWMOS1, the motor 3, the power MOS transistor HPWMOS2, and to the power supply Vm in this order.

When the power MOS transistor HPWMOS1 and the power MOS transistor LPWMOS2 are turned "OFF" and the power MOS transistor HPWMOS2 and the power MOS transistor LPWMOS1 are turned from "OFF" to "ON", the regenerative current flows from the terminal Pad1, the power MOS transistor LPWMOS1, the motor 3, the power MOS transistor HPWMOS2, and to the power supply Vm in this order.

When the power MOS transistor HPWMOS2 and the power MOS transistor LPWMOS1 are turned from "ON" to "OFF" and the power MOS transistor HPWMOS1 and the power MOS transistor LPWMOS2 are in an "OFF" state, the regenerative current flows to the terminal Pad1, the power MOS transistor LPWMOS2, the motor 3, the power MOS transistor HPWMOS1, and the power supply Vm in this order.

When the power MOS transistor HPWMOS1 and the power MOS transistor LPWMOS2 are turned "OFF" and the power MOS transistor HPWMOS1 and the power MOS transistor LPWMOS2 are turned from "OFF" to "ON", the regenerative current flows to the terminal Pad1, the power MOS transistor LPWMOS2, the motor 3, the power MOS transistor HPWMOS1, and the power supply Vm in this order.

Figure 3B:
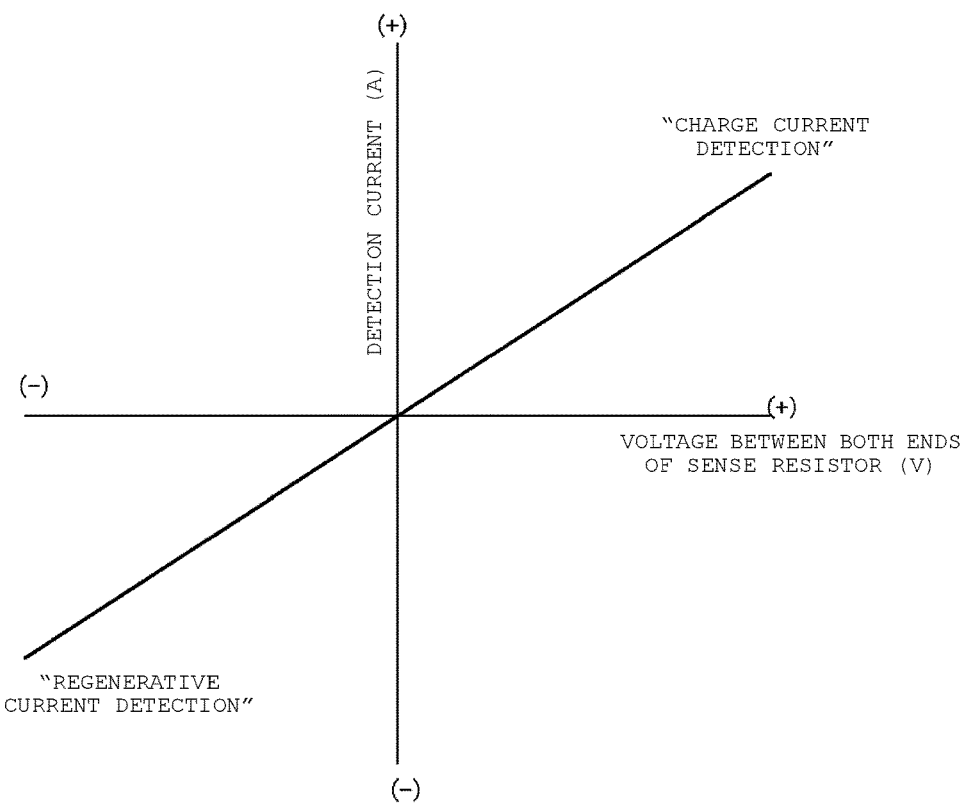
Figure 4A:
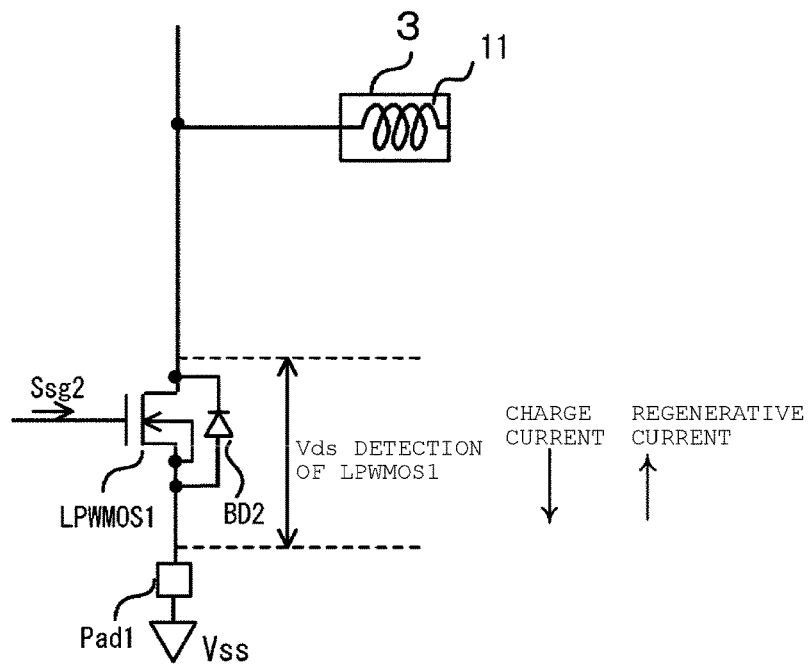
FIGS. 4A and 4B are diagrams illustrating motor current detection in a second comparative example.
Figure 4B:
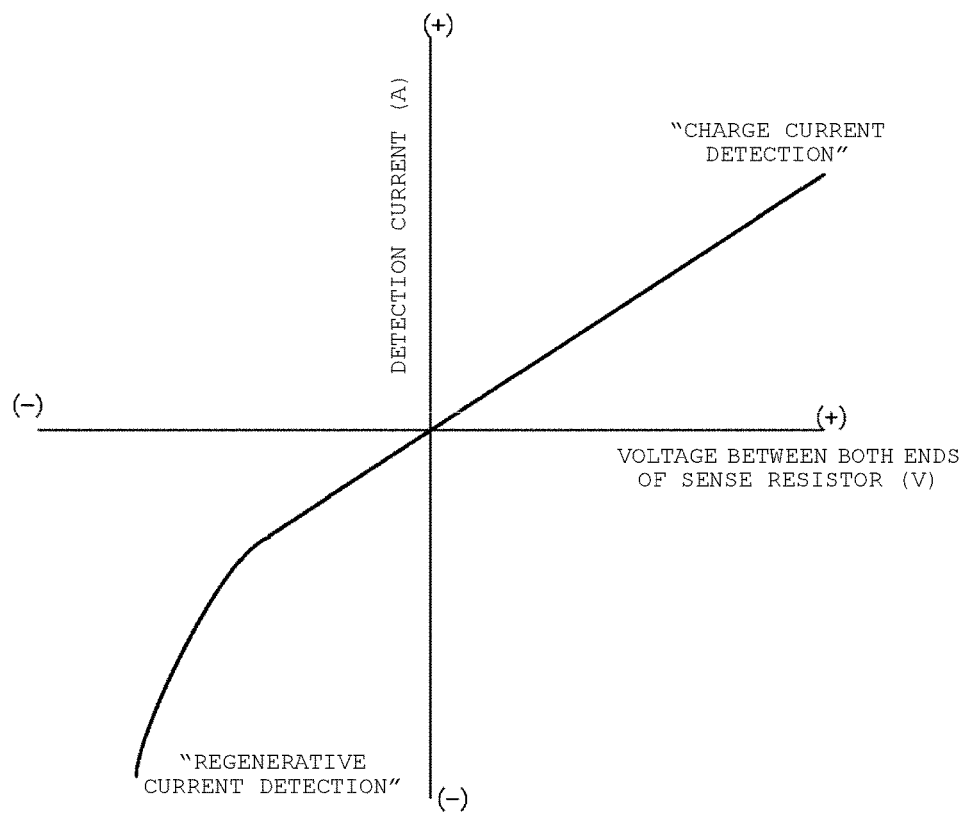

Description is provided for the motor current detection of a low-side power MOS transistor in the related art with reference to FIGS. 3A and 3B, and FIGS. 4A and 4B. FIGS. 3A and 3B are diagrams illustrating motor current detection in a first comparative example, FIG. 3A is a schematic circuit diagram, and FIG. 3B is a graph of detection characteristics. FIGS. 4A and 4B are diagrams illustrating motor current detection in a second comparative example, FIG. 4A is a schematic circuit diagram, and FIG. 4B is a graph of detection characteristics.

As illustrated in FIG. 3A, a sense resistor RS1 is provided between the terminal Pad1 and a ground potential (low potential side power supply) Vss in the first comparative example. The charge current and the regenerative current flowing through the sense resistor RS1 are detected as a voltage across the sense resistor.

As illustrated in FIG. 3B, in the first comparative example, linear property is excellent from a low current area to a high current area in a charge current detection area and a regenerative current detection area, and it is possible to perform current detection with high accuracy. However, an external resistor is used for the sense resistor RS1 and thus, adds to the number of components, which is problematic.

As illustrated in FIG. 4A, in the second comparative example, the charge current and the regenerative current flowing in the power MOS transistor LPMOS1 of the low-side are detected as a voltage Vds between the drain and the source of the power MOS transistor LPMOS1.

As illustrated in FIG. 4B, in the second comparative example it is possible to detect the charge current flowing in the power MOS transistor LPMOS1 of the low-side with high accuracy from a low current area to a high current area. However, the regenerative current flowing in the power MOS transistor LPMOS1 of the low-side can be detected with high accuracy in the low current area, but cannot be detected with high accuracy in the high current area, which is problematic.

Figure 5:
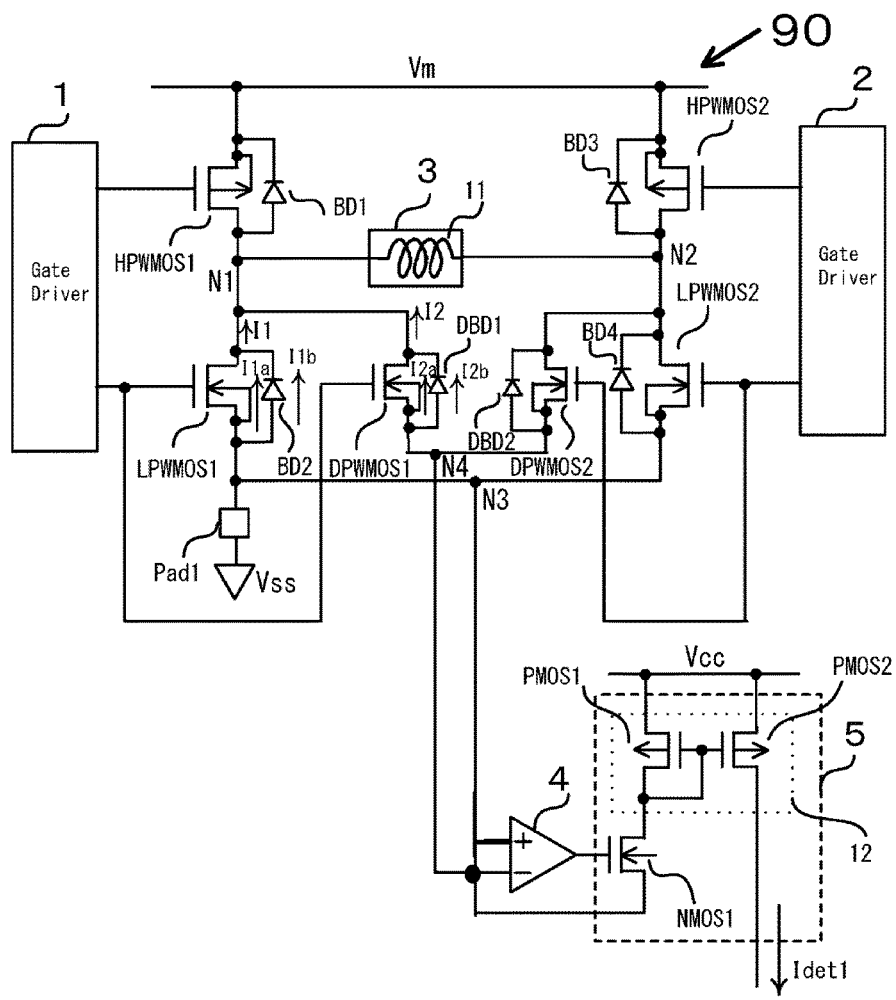
FIG. 5 is a diagram illustrating a regenerative current flowing in the regenerative current detection circuit according to the first embodiment.

Description is provided for the regenerative current flowing in the regenerative current detection circuit 90 with reference to FIG. 5. FIG. 5 is a diagram illustrating the regenerative current flowing in a regenerative current detection circuit according to the first embodiment and illustrates the regenerative current which flows to the low-side when the power MOS transistor HPWMOS1 and the power MOS transistor LPWMOS2 are turned from "ON" to "OFF" and the power MOS transistor HPWMOS2 and the power MOS transistor LPWMOS1 are in an "OFF" state.

As illustrated in FIG. 5, a regenerative current I1a flowing in the power MOS transistor LPWMOS1 and a regenerative current I1b flowing in the body diode BD2 are added and flow to the node N1 side as a regenerative current I1. Similarly, a regenerative current I2a flowing in the power MOS transistor DPWMOS1 and a regenerative current I2b flowing in the body diode DBD1 are added and flow to the node N1 side as a regenerative current I2.

When the regenerative current flows, a drain-source voltage Vds1 of the power MOS transistor LPWMOS1 matches a drain-source voltage Vds2 of the power MOS transistor DPWMOS1 and thus, the power MOS transistor LPWMOS1 and the power MOS transistor DPWMOS1 operate as a current mirror.

For that reason, when a current mirror ratio is set as m1, the mirror current can be represented as $$I2 = I1 \times m1 \qquad \text{Equation (1).}$$

Here, the current mirror ratio m1 causes the value (gate width (Wg2)/gate length (Lg)) of the power MOS transistor DPWMOS1 to be a value of m1 times the value of (gate width (Wg1)/gate length (Lg)) of the power MOS transistor LPWMOS1. It is preferable to use the power MOS transistor LPWMOS1 and the power MOS transistor DPWMOS1 whose electrical characteristics such as a threshold voltage (Vth) or a withstand voltage and a gate length (Lg) are the same.

The power MOS transistor DPWMOS1 and the body diode DBD1 are provided for detection of the regenerative current and thus, a value of the current mirror ratio m1 is preferably set to be less than or equal to 1 in order to reduce an increase in a chip area of the regenerative current detection circuit 90.

The feedback amplifier 4 compares the regenerative current I1 with the regenerative current I2 and outputs the comparison result. The detection current Idet1 is detected by the current detection unit 5 based on an output signal output from the feedback amplifier 4. The detection current Idet1 can be represented as $$Idet1 = I2(=I1 \times m1) \qquad \text{Equation (2)}$$

and the regenerative current can be detected with high accuracy.

Here, although the current mirror ratio of the current mirror circuit 12 is set as 1, when the current mirror ratio of a current mirror circuit 12 is set as (1/m1) by setting the (gate width/gate length) of the Pch MOS transistor PMOS2 as a value of (1/m1) times (gate width/gate length) of the Pch MOS transistor PMOS1, the current detection unit 5 can detect the detection current Idet1 as the regenerative current I1 which flows in the power MOS transistor LPWMOS1.

Similarly, the power MOS transistor LPWMOS2 and the power MOS transistor DPWMOS2 for detection also operate as a current mirror, and the current mirror ratio is set to m1.

As described above, the regenerative current detection circuit 90 of the first embodiment is provided with the gate driver 1, the gate driver 2, the motor 3, the feedback amplifier 4, the current detection unit 5, the power MOS transistors HPWMOS1 and HPWMOS2, the power MOS transistors LPWMOS1 and LPWMOS2, the power MOS transistors DPWMOS1 and DPWMOS2, the body diodes BD1 to BD4, the body diodes DBD1 and DBD2, and the terminal Pad1. When the regenerative current flows, the power MOS transistor LPWMOS1 and the power MOS transistor DPWMOS1 operate as a current mirror. The regenerative current I2 flowing in the power MOS transistor DPWMOS1 for detection and the body diode DBD1 for detection is obtained by multiplying the regenerative current I1 flowing in the power MOS transistor LPWMOS1 and the body diode BD2 by the current mirror ratio m1. The feedback amplifier 4 compares the regenerative current I1 with the regenerative current I2 and outputs the comparison result. The current detection unit 5 detects the detection current Idet1 based on the output signal output from the feedback amplifier 4.

For that reason, it is possible to detect the regenerative current flowing in the power MOS transistor LPWMOS1 provided at the low-side with high accuracy.

In the first embodiment, although the regenerative current flowing in the power MOS transistor LPWMOS1 is described, similarly, it is also possible to detect the regenerative current flowing in the power MOS transistor LPWMOS2 when the power MOS transistor HPWMOS2 and the power MOS transistor LPWMOS1 are turned from "ON" to "OFF" and the power MOS transistor HPWMOS1 and the power MOS transistor LPWMOS2 are in an "OFF" state with high accuracy.

Second Embodiment

Figure 6:
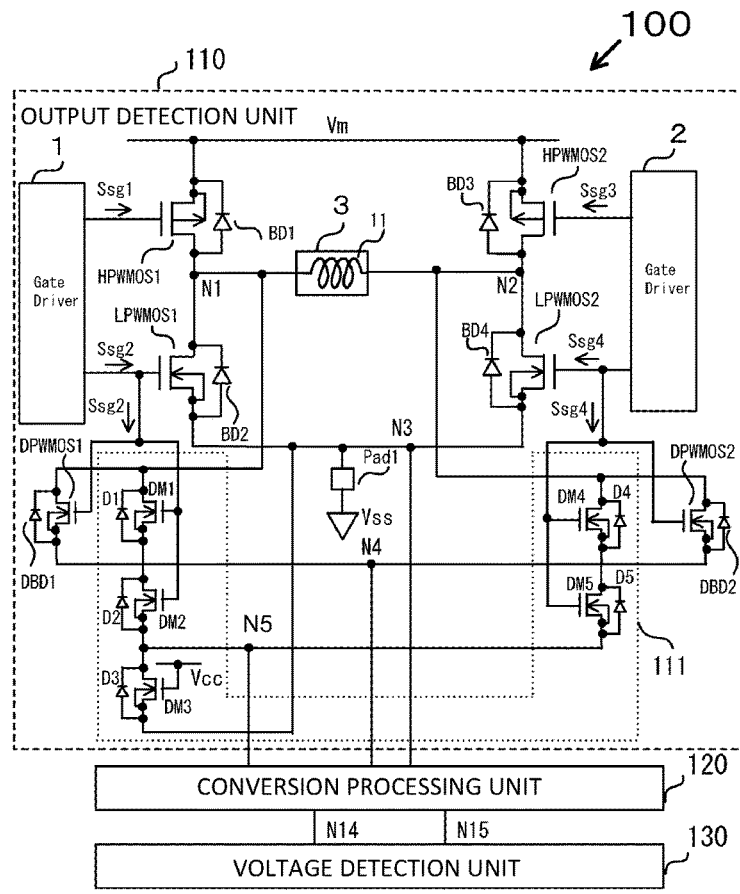
FIG. 6 is a circuit diagram illustrating a motor current detection system according to a second embodiment.
Figure 7:
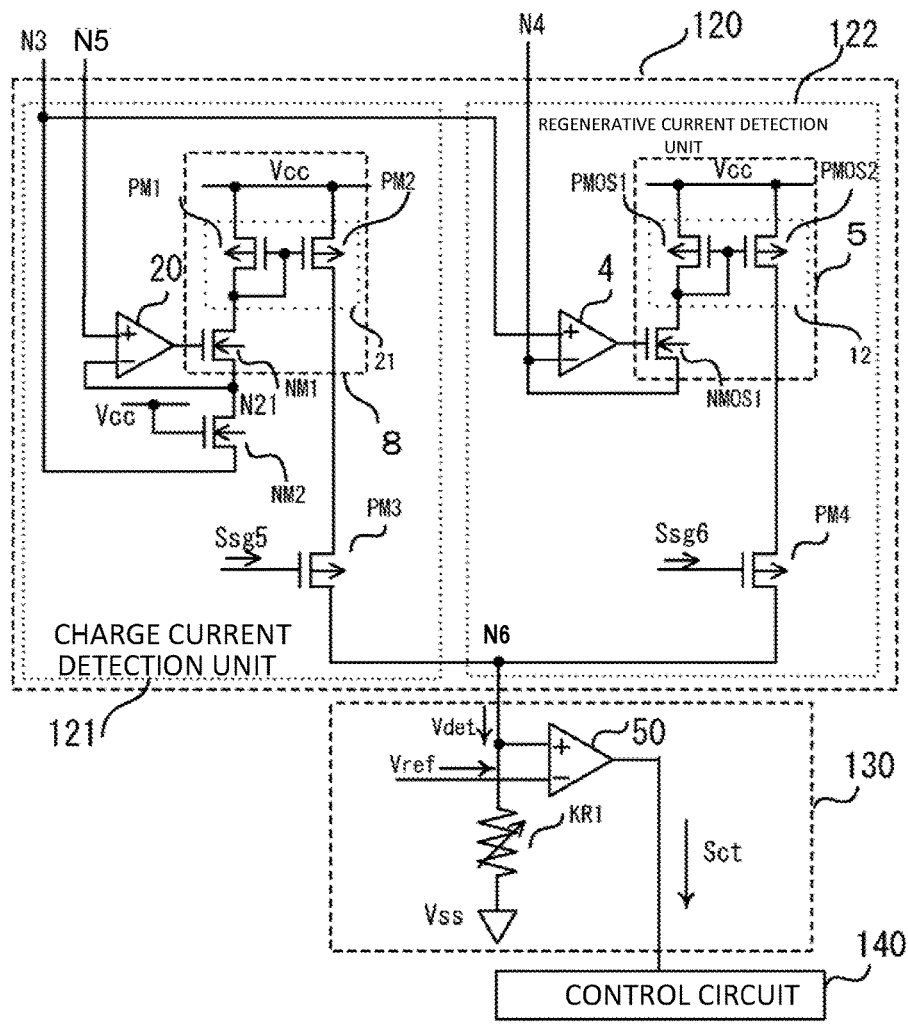
FIG. 7 is a circuit diagram illustrating a configuration of a conversion processing unit and a voltage detection unit according to the second embodiment.

Next, a motor current detection system according to a second embodiment is described with reference to the drawings. FIG. 6 is a circuit diagram illustrating a motor current detection system according to a second embodiment. FIG. 7 is a circuit diagram illustrating a configuration of a conversion processing unit and a voltage detection unit according to the second embodiment. In the second embodiment, it is possible to respectively detect the charge current and the regenerative current that flow in the power MOS transistor LPWMOS1 and the power MOS transistor LPWMOS2 provided at the low-side with high accuracy.

In the following, the same constituent elements as those of the first embodiment are assigned the same reference numerals and descriptions thereof are omitted and constituent elements different from those of first embodiment are described.

As illustrated in FIG. 6, a motor current detection system 100 includes an output detection unit 110, a conversion processing unit 120, and a voltage detection unit 130.

The output detection unit 110 includes the gate driver 1, the gate driver 2, the motor 3, the detection transistor unit 111, the power MOS transistors HPWMOS1 and HPWMOS2, the power MOS transistors LPWMOS1 and LPWMOS2, the power MOS transistors DPWMOS1 and DPWMOS2, the body diodes BD1 to BD4, the body diodes DBD1 and DBD2, and the terminal Pad1.

The detection transistor unit 111 includes the power MOS transistors DM1 to DM5 and the body diodes D1 to D5. The power MOS transistors DM1 to DM5 are the Nch power MOS transistors used for detection of the charge current along with the body diodes D1 to D5 are body diodes.

One end (drain) of the power MOS transistor DM1 is connected to the node N1 and one end of the motor coil 11 of the motor 3, the other end (source) thereof is connected to one end (drain) of the power MOS transistor DM2, and the control signal Ssg2 is input to a control terminal (gate) thereof. The body diode D1 is connected in parallel with the power MOS transistor DM1.

One end (drain) of the power MOS transistor DM2 is connected to the other end of the power MOS transistor DM1, the other end (source) thereof is connected to a node N5 and one end (drain) of the power MOS transistor DM3, and the control signal Ssg2 is input to a control terminal (gate) thereof. The body diode D2 is connected in parallel between both ends of the power MOS transistor DM2.

One end (drain) of the power MOS transistor DM4 is connected to the node N2 and the other end of the motor coil 11 of the motor 3, the other end (source) thereof is connected to one end (drain) of the power MOS transistor DM5, and the control signal Ssg4 is input to a control terminal (gate) thereof. The body diode D4 is connected in parallel with the power MOS transistor DM4.

One end (drain) of the power MOS transistor DM5 is connected to the other end of the power MOS transistor DM4, the other end (source) thereof is connected to the node N5 and one end (drain) of the power MOS transistor DM3, and the control signal Ssg4 is input to a control terminal (gate) thereof. The body diode D5 is connected in parallel with the power MOS transistor DM5.

One end (drain) of the power MOS transistor DM3 is connected the node N5, the other end of the power MOS transistor DM2, and the other end of the power MOS transistor DM5, and the other end (source) thereof is connected the ground potential (low potential side power supply) Vss through the terminal Pad1, and a control terminal (gate) thereof is connected to the power supply (high potential side power supply) Vcc. When the power supply (high potential side power supply) Vcc is supplied, the power MOS transistor DM3 is turned "ON". The body diode D3 is connected in parallel with the power MOS transistor DM3.

When the charge current flows to the power MOS transistor LPWMOS1 side, the power MOS transistor LPWMOS1 and the power MOS transistors DM1 to DM3 in a three-stage configuration operate as a current mirror. When the charge current flows to the power MOS transistor LPWMOS2 side, the power MOS transistor LPWMOS2 and the power MOS transistors DM4, DM5, and DM3 in a three-stage configuration operate as a current mirror. The (gate width (Wg)/gate length (Lg)) of the power MOS transistors DM1 to DM5 are set to a value of n1 times (current mirror ratio n1) the value of (gate width (Wg)/gate length (Lg)) of the power MOS transistors LPWMOS1 and LPWMOS2.

It is preferable to use the power MOS transistor LPWMOS1, the power MOS transistor DPWMOS2, and the power MOS transistors DM1 to DM5 whose electrical characteristics such as threshold voltage (Vth), breakdown voltage and gate length (Lg) are the same.

The power MOS transistors DM1 to DM5 and the body diodes D1 to D5 are provided for detection of the charge current and thus, a value of the current mirror ratio n1 is preferably set to be less than or equal to 1 in order to reduce an increase in a chip area of the motor current detection system 100.

Here, although the power MOS transistors DM1 to DM3 (three-stage configuration) are provided between the node N1 and the node N3 and the power MOS transistor 4, the power MOS transistor 5, the power MOS transistor 3 (three-stage configuration) are provided between the node N2 and the node N3, the power MOS transistors may have an odd-number of stages, which is greater than or equal to five.

As illustrated in FIG. 7, the conversion processing unit 120 includes a charge current detection unit 121 and a regenerative current detection unit 122. The charge current detection unit 121 outputs a detection voltage obtained by detecting the charge current and converting the charge current into a voltage. The regenerative current detection unit 122 outputs a detection voltage obtained by detecting the regenerative current and converting the regenerative current into a voltage.

The charge current detection unit 121 includes a current detection unit 8, a feedback amplifier 20, an NchMOS transistor NM2, and a Pch MOS transistor PM3.

A plus (+) port of an input side of the feedback amplifier (i.e., the positive input) 20 is connected to the node N5 and one end (drain) of the power MOS transistor DM3, a minus (−) port of the input side thereof (i.e., the negative input) is connected to the node N21 and one end (drain) of the Nch MOS transistor NM2, and the feedback amplifier 20 compares a signal of the plus (+) port of the input side with a signal of the minus (−) port of the input side and outputs the comparison result.

One end (drain) of the Nch MOS transistor NM2 is connected to the node N21 and the minus (−) port of the input side of the feedback amplifier 20, the other end (source) thereof is connected to the ground potential (low potential side power supply) Vss through the terminal Pad1, and a control terminal (gate) thereof is connected to the power supply (high potential side power supply) Vcc.

When the power supply (high potential side power supply) Vcc is supplied to Nch MOS transistor NM2 and the current detection unit 8 operates, the Nch MOS transistor NM2 is turned "ON" and a feedback signal is input to the minus (−) port of the input side of the feedback amplifier 20 from the node N21.

The current detection unit 8 includes an Nch MOS transistor NM1, a Pch MOS transistor PM1, and a Pch MOS transistor PM2.

One end (source) of the Pch MOS transistor PM1 is connected to the power supply (high potential side power supply) Vcc and a control terminal (gate) thereof is connected to the other end (source) and the control terminal (gate) of the Pch MOS transistor PM2. One end (source) of the Pch MOS transistor PM2 is connected to the power supply (high potential side power supply) Vcc and a control terminal (gate) thereof is connected to the control terminal (gate) of the Pch MOS transistor PM1. The Pch MOS transistor PM1 and the Pch MOS transistor PM2 form the current mirror circuit 21.

One end (drain) of the Nch MOS transistor NM1 is connected to the other end (drain) of the Pch MOS transistor PM1, the output signal of the feedback amplifier 20 is input to a control terminal (gate) thereof, and the other end (source) thereof is connected to the node N21.

One end (source) of the Pch MOS transistor PM3 is connected to the other end (drain) of the Pch MOS transistor PM2, the other end (drain) thereof is connected to the node N6, a control signal Ssg5 is input to a control terminal (gate) thereof, and current-to-voltage conversion is performed.

The regenerative current detection unit 122 includes the feedback amplifier 4, the current detection unit 5, and a Pch MOS transistor PM4. The feedback amplifier 4 and the current detection unit 5 are the same as those of the first embodiment and thus, description thereof is omitted.

One end (source) of the Pch MOS transistor PM4 is connected to the other end (drain) of the Pch MOS transistor PMOS2, the other end (drain) thereof is connected to the node N6, a control signal Ssg6 is input to a control terminal (gate) thereof, and current-to-voltage conversion is performed.

As illustrated in FIG. 7, the voltage detection unit 130 includes a comparator 50 and a variable resistor KR1.

One end of the variable resistor KR1 is connected to a plus (+) port of an input side of the comparator 50 and the other end thereof is connected to ground potential (low potential side power supply), and a variable resistor is set for the variable resistor KR1.

A plus (+) port of an input side of the comparator 50 is connected to the node N6 and one end of the variable resistor KR1 and receives a detection voltage Vdet, which is an output of the conversion processing unit 120, as an input, a minus (−) port of the input side of the comparator 50 receives a reference voltage Vref as an input, and the comparator 50 compares a signal of the plus (+) port of the input side with a signal of the minus (−) port of the input side and outputs the comparison result to the control circuit 140, as a control signal Sct.

The control circuit 140 controls a logic-system circuit portion including the gate driver 1 and the gate driver 2 based on the control signal Sct.

Figure 9:
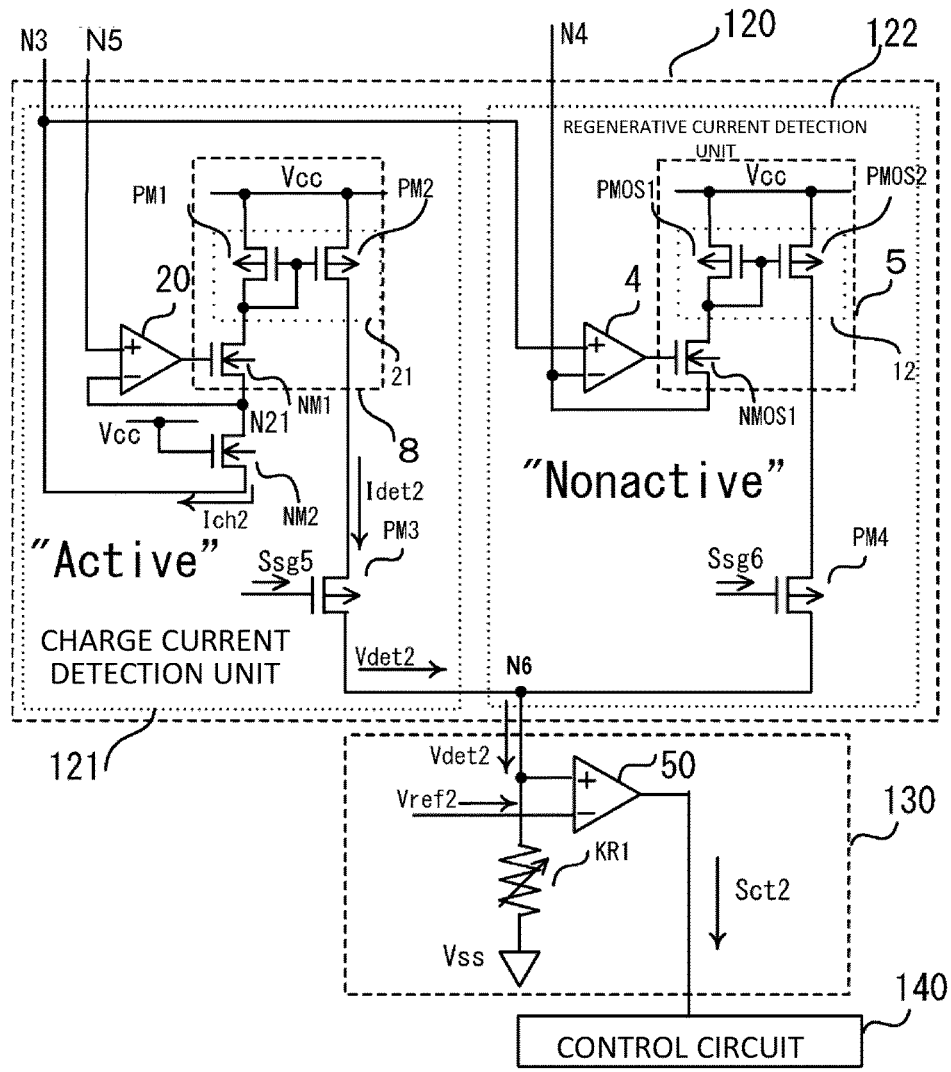
FIG. 9 is a diagram illustrating detection of the charge current generated in the motor current detection system according to the second embodiment.

Description is provided for the charge current in the motor current detection system 100 with reference to FIGS. 8A to 8C and FIG. 9. FIGS. 8A to 8C are diagrams for explaining the flow of the charge current, FIG. 8A is a diagram for explaining the flow of the charge current, FIG. 8B is a diagram for illustrating operation states of the conversion processing unit and the voltage detection unit, and FIG. 8C is a diagram for explaining states of a node $V_{N1}$ and a node $V_{N5}$. FIG. 9 is a diagram illustrating detection of the charge current generated in the motor current detection system.

As illustrated in FIG. 8A, the charge current in the motor current detection system 100 flows similarly as in FIG. 2A.

As illustrated in FIG. 8B, when detecting the charge current in the motor current detection system 100, the charge current detection unit 121 and the voltage detection unit are placed in an "Active" state and the regenerative current detection unit 122 is placed in a "Nonactive" state.

As illustrated in FIG. 8C, when the power MOS transistor LPWMOS1 of the low-side is turned ON, the charge current flows from the node N1 to the ground potential (low potential power supply) Vss.

On the other hand, when the power MOS transistor LPWMOS2 of the low-side is turned ON, the charge current flows from the node N2 to the ground potential (low potential power supply) Vss.

For that reason, the voltage $V_{N1}$ of the node N1 becomes a drain-source voltage "$V_{DS}$" of the power MOS transistor LPWMOS1 of the low-side or the power MOS transistor LPWMOS2 of the low-side and the voltage $V_{N5}$ of the node N5 becomes "$\frac{1}{3} V_{DS}$".

As illustrated in FIG. 9, a charge current Ich2 flows from the other end (source) of the Nch MOS transistor NM2 to the node N3 side. The plus (+) port of the input side of the feedback amplifier 20 receives a signal ("$\frac{1}{3} V_{DS}$") of the node N5 as an input and the minus (−) port of the input side thereof receives a signal of the node N21 as an input. The feedback amplifier 20 compares the charge current flowing in the power MOS transistor LPPWMOS1 and the power MOS transistor LPPWMOS2 with the current flowing in the detection transistor unit 111 and outputs the comparison result to the current detection unit 8.

The current detection unit 8 outputs a detection current Idet2 from the other end (drain) side of the Pch MOS transistor PM2 based on the output signal output from the feedback amplifier 20.

In a case where the current mirror ratio of the current mirror circuit 21 is 1, when the charge current flowing in the power MOS transistor LPPWMOS1 and the power MOS transistor LPPWMOS2 is set to Ich2, the detection current Idet2 can be represented as $$Idet2 = Ich2 \times (n1) \quad \text{Equation (3)}$$

and the charge current can be detected with high accuracy.

Here, although the current mirror ratio of the current mirror circuit 21 is set to 1, when the current mirror ratio of a current mirror circuit 21 is set as (1/n1) by setting the value of (gate width/gate length) of the Pch MOS transistor PM2 as a value of (1/n1) times the value of (gate width/gate length) of the Pch MOS transistor PM1, the current detection unit 8 can detect the detection current Idet2 as the charge current which flows in the power MOS transistor LPWMOS1 or the power MOS transistor LPWMOS2.

When the control signal Ssg5 is in an enable state (low level), the Pch MOS transistor PM3 converts the detection current Idet2 to the detection voltage Vdet2. The plus (+) port of the input side of the comparator 50 receives the detection voltage Vdet2 as an input, the minus (−) port of the input side of the comparator 50 receives the reference voltage Vref2 used for charge current detection as an input, and the comparator 50 outputs the comparison result to the control circuit 140 as the control signal Sct2.

Figure 11:
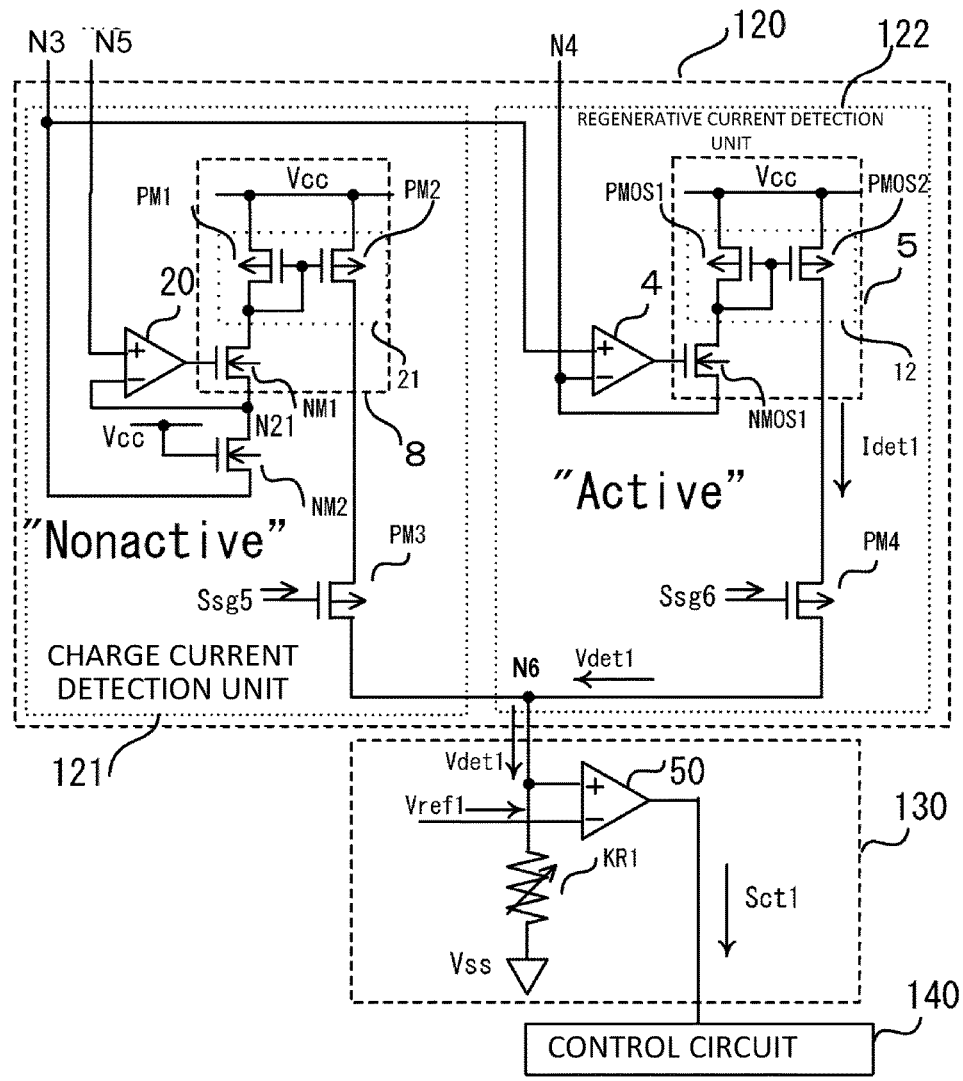
FIG. 11 is a diagram illustrating detection of the regenerative current generated in the motor current detection system according to the second embodiment.

Description is next given for the regenerative current in the motor current detection system 100 with reference to FIGS. 10A and 10B and FIG. 11. FIGS. 10A and 10B are diagrams for explaining the regenerative current generated in the motor current detection system, FIG. 10A is a diagram for explaining the flow of the regenerative current, and FIG. 10B is a diagram illustrating operation states of the conversion processing unit and the voltage detection unit. FIG. 11 is a diagram illustrating detection of the regenerative current generated in the motor current detection system.

As illustrated in FIG. 10A, the regenerative current in the motor current detection system 100 flows similarly as in FIG. 2B. As illustrated in FIG. 10B, when the regenerative current flows in the motor current detection system 100, the regenerative current detection unit 122 and the voltage detection unit 130 are placed in an "Active" state and the charge current detection unit 121 is placed in a "Nonactive" state.

As illustrated in FIG. 11, when the regenerative current flows in the power MOS transistor LPWMOS1 or the power MOS transistor LPWMOS2 of the low-side, similar to the regenerative current detection circuit 90 of the first embodiment, the detection current Idet1 is detected from the other end (drain) side of the Pch MOS transistor PMOS2 of the current mirror circuit 12.

When the control signal Ssg6 is in an enable state (low level), the Pch MOS transistor PM4 converts the detection current Idet1 to the detection voltage Vdet1. The plus (+) port of the input side of the comparator 50 receives the detection voltage Vdet1 as an input, the minus (−) port of the input side of the comparator 50 receives the reference voltage Vref1, which is used in detecting the regenerative current, as an input, and the comparator 50 outputs the comparison result to the control circuit 140 as the control signal Sct1.

Here, in a case where the regenerative current detection is not needed and only the charge current detection is needed in the motor current detection system 100, the motor current detection system 100 can be used as a charge current detection circuit configured with the gate driver 1, the gate driver 2, the motor 3, the detection transistor unit 111, the power MOS transistors HPWMOS1 and HPWMOS2, the power MOS transistors LPWMOS1 and LPWMOS2, the body diodes BD1 to BD4, the terminal Pad1, the feedback amplifier 20, the current detection unit 8, and the Nch MOS transistor NM2.

As described above, in the motor current detection system of the second embodiment, the output detection unit 110, the conversion processing unit 120, and the voltage detection unit 130 are provided. The output detection unit 110 includes the gate driver 1, the gate driver 2, the motor 3, the detection transistor unit 111, the power MOS transistors HPWMOS1 and HPWMOS2, the power MOS transistors LPWMOS1 and LPWMOS2, the power MOS transistors DPWMOS1 and DPWMOS2, the body diodes BD1 to BD4, the body diodes DBD1 and DBD2, and the terminal Pad1. The conversion processing unit 120 includes the charge current detection unit 121 and the regenerative current detection unit 122. The voltage detection unit 130 includes the comparator 50 and the variable resistor KR1. When detecting the charge current, the charge current detection unit 121 and the voltage detection unit 130 are placed into an "Active" state and the regenerative current detection unit 122 is placed into a "Nonactive" state. When detecting the regenerative current, the regenerative current detection unit 122 and the voltage detection unit 130 are placed into an "Active" state and the charge current detection unit 121 is placed into a "Nonactive" state. The voltage detection unit 130 outputs the detection result of the charge current detection unit 121 or the regenerative current detection unit 122 to the control circuit 140 as the control signal Sct.

For that reason, in the motor current detection system 100, it is possible to respectively detect the charge current and the regenerative current that flow in the power MOS transistor LPWMOS1 and the power MOS transistor LPWMOS2 of the low-side with high accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A regenerative current detection circuit comprising:
a first power MOS transistor that is configured as a current mirror to a second power MOS transistor connected to drive a motor winding;
a first feedback amplifier that compares a first regenerative current that flows in the first power MOS transistor with a second regenerative current that flows in the second power MOS transistor and outputs a comparison result, the second regenerative current being obtained by multiplying the first regenerative current by a current mirror ratio; and a current detection circuit that outputs a detection current based on the comparison result.

2. The regenerative current detection circuit according to claim 1, wherein the current detection circuit includes a first transistor, a second transistor, and a third transistor, the first transistor is turned ON by an output signal of the first feedback amplifier which is input to a control terminal of the first transistor, the second transistor and the third transistor constitute a first current mirror circuit, one end of the second transistor is connected to a control terminal of the third transistor and one end of the first transistor, and the control terminal of the third transistor is connected to the control terminal of the second transistor, and the third transistor outputs the detection current when the first transistor is turned ON.

3. The regenerative current detection circuit according to claim 1, wherein a negative input of the feedback amplifier is connected to a source of the second power MOS transistor and a positive input of the feedback amplifier is connected to a source of the first power MOS transistor.

4. The charge current detection circuit according to claim 1, wherein the first power MOS transistor is an Nch MOS transistor provided at a low-side.

5. A motor current detection system comprising:

a first power MOS transistor that includes one end being connected to a power supply, the other end being connected to one end of a motor, and a control terminal to which a first control signal is input;

a second power MOS transistor that includes one end being connected to one end of the motor and the other end of the first power MOS transistor and a control terminal to which a second control signal is input;

a third power MOS transistor that includes one end being connected to one end of the motor and the other end of the first power MOS transistor and a control terminal to which the second control signal is input;

a detection transistor unit in which a plurality of power MOS transistors are connected in series, the second control signal being input to the control terminal of each of the plurality of power MOS transistors, and of which one end side is connected to the one end of the motor;

a regenerative current detection unit that includes a first feedback amplifier that compares a first regenerative current flowing in the second power MOS transistor with a second regenerative current flowing to the third power MOS transistor and outputs the comparison result, and a first current detection circuit that outputs a first detection current based on the comparison result of the first feedback amplifier; and a charge current detection unit that includes a second feedback amplifier that compares a first charge current flowing to the second power MOS transistor with a second charge current flowing to the detection transistor unit and outputs the comparison result, and a second current detection circuit that outputs a second detection current based on the comparison result of the second feedback amplifier, wherein the second power MOS transistor and the third power MOS transistor operate as a current mirror when the regenerative current flows, and the second power MOS transistor and the detection transistor unit operate as a current mirror when the charge current flows.

6. The motor current detection system according to claim 5, further comprising:

a first conversion unit that converts the first detection current into a first detection voltage;

a second conversion unit that converts the second detection current into a second detection voltage; and a comparator that compares the first detection voltage with a first reference voltage when detecting the regenerative current, compares the second detection voltage with a second reference voltage when detecting the charge current, and outputs the comparison result.

7. The motor current detection system according to claim 6, further comprising:

a fourth power MOS transistor that includes one end being connected to the power supply, the other end being connected to the other end of the motor, and a control terminal to which a third control signal is input; and a fifth power MOS transistor that includes one end being connected to the other end of the motor and the other end of the fourth power MOS transistor and a control terminal to which a fourth control signal is input.

8. The motor current detection system according to claim 5, wherein the second power MOS transistor, the fifth power MOS transistor, and the power MOS transistors of the detection transistor unit are Nch MOS transistors provided at a low-side.

* * * * *